(12) United States Patent
Hagihara et al.

(10) Patent No.: US 6,791,188 B2
(45) Date of Patent: Sep. 14, 2004

(54) THIN FILM ALUMINUM ALLOY AND SPUTTERING TARGET TO FORM THE SAME

(75) Inventors: Junichiro Hagihara, Kagoshima-ken (JP); Ichiro Tokuda, Kagoshima-ken (JP)

(73) Assignee: Vacuum Metallurgical Co., Ltd., Chiba (JP)

(*) Notice: Subject to any disclaimer, the term of this patent is extended or adjusted under 35 U.S.C. 154(b) by 24 days.

(21) Appl. No.: 10/228,064

(22) Filed: Aug. 27, 2002

(65) Prior Publication Data

US 2003/0047812 A1 Mar. 13, 2003

(30) Foreign Application Priority Data

Aug. 31, 2001 (JP) ........................................ 2001-263085

(51) Int. Cl.[7] .............................................. H01L 23/48
(52) U.S. Cl. ........................................ 257/771; 148/415
(58) Field of Search .................................. 257/741, 768, 257/770, 771, 767; 148/439–442, 415

(56) References Cited

U.S. PATENT DOCUMENTS

| | | |
|---|---|---|
| 5,514,909 A | 5/1996 | Yamamoto et al. |
| 6,033,542 A | 3/2000 | Yamamoto et al. |
| 6,299,706 B1 * | 10/2001 | Miyake et al. ............... 148/415 |

FOREIGN PATENT DOCUMENTS

JP  2000-235961  8/2000

* cited by examiner

Primary Examiner—Nathan J. Flynn
Assistant Examiner—Leonardo Andújar
(74) Attorney, Agent, or Firm—Arent Fox PLLC

(57) ABSTRACT

Disclosed is a thin film aluminum alloy which is limited in the generation of hillocks while maintaining a low specific resistance and hardness irrespective of annealing temperature. In order to obtain the thin film aluminum alloy having a Vickers hardness of 30 Hv or less and a film stress (absolute value indication) of 30 kg/mm$^2$ or less when performing annealing treatment at a temperature ranging from 25° C. to 500° C., wherein said hardness and said film stress are distributed in a predetermined hardness range and in a predetermined film stress range respectively within the temperature range of the above-mentioned annealing treatment and are respectively almost constant against annealing temperature, the thin film aluminum alloy being formed as a film on a substrate by a sputtering method using a sputtering target having a composition comprising 0.5 to 15 atom % of one or more types selected from Ag, Cu, Mg and Zn and 0.01 to 5 atom % of one or more types selected from Co, Cr, Gd, Hf, Li, Mn, Mo, Nb, Nd, Ni, Pd, Pt, Ru, Sc, Sr, Ta, Ti, W, Y and Zr, and, as remnant, Al and unavoidable impurities.

6 Claims, 2 Drawing Sheets

THIN FILM ALUMINUM ALLOY AND SPUTTERING TARGET TO FORM THE SAME

BACKGROUND OF THE INVENTION

1. Field of the Invention

The present invention relates to a thin film aluminum alloy used as a conductive thin film material for flat type display circuits, such as a liquid crystal display and for semiconductor integrated circuits, and to a sputtering target to form the thin film aluminum alloy.

2. Description of the Related Art

Either aluminum type alloys or copper type alloys are currently used as thin film electrodes and wire materials for semiconductor elements and liquid crystal displays. Among them, copper type alloys have insufficient adhesion to an oxide film and unsatisfactory corrosion resistance and involve difficulties in plasma etching and are therefore used solely for devices in specific use. Aluminum alloys are therefore usually used. Such aluminum materials are required to be decreased in specific resistance and to have hillock resistance. The request for the decrease in specific resistance among these characteristics is intended to prevent signal delay along with accelerated trends to up-sizing and high refinement of wiring width in the fields of recent liquid crystal displays as well as semiconductor elements. On the other hand, the hillock resistance is needed to prevent fine projections (hillocks) from being formed on the film surface due to internal stress caused by Al which inherently has low heat resistance in heating treatment (annealing treatment) after forming electrodes and wiring material films when using an aluminum alloy as electrode and wiring materials having a low specific resistance.

As aluminum type alloys having this type of hillock resistance, aluminum alloys which are made to contain, as an alloy component, based on Al at least one type selected from Nd, Gd and Dy in an amount exceeding 1.0 atom % and up to 15 atom %, are known as shown in Japanese Patent No. 2733006. Eventually, aluminum type electrode materials formed on a substrate for a liquid crystal display suffer from the occurrence of hillocks through heating treatment (annealing treatment) which is inevitable in the production step of the device. For these electrode materials, aluminum alloys are formed by adding Nd and the like to Al for the purpose of improving heat resistance due to a solid solution effect.

Also, for example, Japanese Patent Application Laid-Open Specification No. 2000-235961 discloses a conductive thin film formed using an aluminum alloy comprising Al as its major component, at least one element selected from Zr, Hf, Cu, Ti, Mo, W, Fe, Cr and Mn in a content of 0.5 to 1.5 atom % as a metallic element being sub-component and at least one element selected from Si and Ge in a content of 0.5 to 1.5 atom % as a semiconductor element forming an alloy in combination with Al. This alloy is made to contain a metallic element for the purpose of preventing the occurrence of hillocks by segregating the metallic element at the grain boundary and to contain a semiconductor element for the purpose of preventing the occurrence of hillocks by allowing the element to form an alloy in combination with Al.

SUMMARY OF THE INVENTION

All of the foregoing current aluminum alloys improve heat resistance by reinforcement due to a solid solution effect and segregation effect obtained by adding other elements to Al. In this case, the raw materials of the aluminum alloys are anneal-treated, because the above solid solution effect and segregation effect bring about an increase in specific resistance at the same time. This process ensures that the elements existing as solid solution in Al precipitate, so that the total amount of the solid solution of the elements put in a solid solution, which is a cause of an increase in specific resistance, decreases and the specific resistance therefore falls.

However, the reduction in specific resistance caused by annealing treatment as mentioned above depends upon the temperature under annealing treatment. Therefore, there is a possibility that no aluminum alloy having a desired low resistance is obtained in relatively low temperature (about 350° C. or less) among annealing treatment conditions. Further, it is difficult to converge the specific resistance to a specified range irrespective of ambient temperature conditions, because the specific resistance varies depending on the heat treatment temperature.

Also, if the content of elements to be added to obtain solid solution and segregation effects is high, the hardness of the film formed using an electrode film-forming sputtering target comprising such an aluminum alloy tends to be high. Such an increase in hardness can be suppressed by the precipitation of the added elements through annealing treatment. However, the hardness varies depending upon the temperature under annealing treatment in the same manner as in the case of the above specific resistance and it is therefore difficult to converge the hardness to a specified range.

In view of the above problems, it is an object of the present invention to provide a thin film aluminum alloy which is limited in the occurrence of hillocks, in which stable low specific resistance is consistently maintained irrespective of annealing treatment temperature, and also to provide a sputtering target used to form the thin film aluminum alloy.

In order to solve the above problems, a thin film aluminum alloy according to the present invention is designed to have a Vickers hardness of 30 Hv or less and a film stress (absolute value indication) of 30 kg/mm$^2$ or less when performing annealing treatment at 25° C. to 500° C. and such physical properties that the above hardness and film stress are distributed in a predetermined hardness range and in a predetermined film stress range respectively within the temperature range of the above-mentioned annealing treatment. The aluminum alloy has the characteristics that the above-mentioned hardness and film stress which inherently vary depending on annealing temperature are distributed in a small variation range within the temperature range of the above-mentioned annealing treatment, so that the dependencies of the hardness and stress on annealing temperature may be neglected approximately and both may be therefore almost regarded as constant against the annealing temperature. In addition, the occurrence of hillocks can be restrained and a low specific resistance, which Al inherently has, can be maintained, because a thin film having a small residual stress (film stress) and a low hardness is formed.

Incidentally, the film stress is expressed as compressive stress when it is minus and as tensile stress when it is plus.

In this case, the thin film aluminum alloy of the present invention preferably comprises, as alloy components, 0.5 to 15 atom % of one or more types selected from Ag, Cu, Mg and Zn, 0.01 to 5 atom % of one or more types selected from Co, Cr, Gd, Hf, Li, Mn, Mo, Nb, Nd, Ni, Pd, Pt, Ru, Sc, Sr, Ta, Ti, W, Y and Zr, and, as remnant, Al and unavoidable impurities. An elemental group consisting of Ag, Cu, Mg and Zn is added as a crystalline nucleus in the above alloy to increase the density of nucleic generation. On the other hand, another elemental group consisting of Co, Cr, Gd, Hf, Li, Mn, Mo, Nb, Nd, Ni, Pd, Pt, Ru, Sc, Sr, Ta, Ti, W, Y and Zr segregates at the grain boundary of the above alloy to prevent crystalline particles from being coarsened. The addition of each of the above elements brings about the result that a fine structure in the aluminum alloy is maintained under annealing and the residual stress is limited to such a small level as mentioned above that the generation of hillocks is restrained, in which a low hardness and a low specific resistance are maintained.

When the content (composition ratio) of at least one or more elements among an elemental group consisting of Ag, Cu, Mg and Zn is less than 0.5 atom % or the content (composition ratio) of at least one or more elements among an elemental group consisting of Co, Cr, Gd, Hf, Li, Mn, Mo, Nb, Nd, Ni, Pd, Pt, Ru, Sc, Sr, Ta, Ti, W, Y and Zr is less than 0.01 atom %, too many hillods are generated to be practical. On the other hand, when the content (composition ratio) of at least one or more elements among an elemental group consisting of Ag, Cu, Mg and Zn exceeds 15 atom % or the content (composition ratio) of at least one or more elements among an elemental group consisting of Co, Cr, Gd, Hf, Li, Mn, Mo, Nb, Nd, Ni, Pd, Pt, Ru, Sc, Sr, Ta, Ti, W, Y and Zr exceeds 5 atom %, the problems arise in that the hardness and specific resistance become higher.

Further, the thin film aluminum alloy ensures that Al and unavoidable impurities including the above-mentioned alloy components can be formed on the substrate by a sputtering method. It is noted that generally the thin film formed by sputtering is used after anneal treatment. But the thin film aluminum alloy of the present invention does not consistently require annealing treatment after sputtering as mentioned above, because it has almost no dependency on annealing temperature, whereby the thin-film forming step can be simplified. (The range of temperature at which an annealing effect is obtained is shifted to a lower temperature side and a similar annealing effect can be expected either at lower temperatures, for example, room temperature (about 25° C.) or at higher temperatures.)

In the meantime, it is assumed that a thin film aluminum alloy having hillock resistance as mentioned above is supposed to develop superplastic deformation, eventually, a phenomenon that grain boundaries formed by fine crystals adjacent to each other in the alloy generate numerous grain boundary slips under the deformation to loosen stress concentration inside of the alloy. This implies that the thin film aluminum alloy has superplastic deformation characteristics. The thin film aluminum alloy of the present invention has a film thickness of several microns or less and is formed on a substrate as the case may be. It is therefore impossible to directly measure the superplatic deformation which is usually measured as huge elongation of a material. Therefore, the hardness characteristics and film stress (internal residual stress) characteristics were measured as the superplastic deformation characteristics to grasp indirectly that the thin film aluminum alloy had the superplastic deformation characteristics. It is noted that the foregoing annealing effect obtained at room temperature is also caused by the superplastic deformation characteristics.

Also, it is suitable to use as electrode or wiring materials in semiconductor elements or liquid crystal displays, because the thin film aluminum alloy obtained in this manner can restrict the number of hillocks with a low specific resistance.

Moreover, a sputtering target to form such a thin film aluminum alloy by a sputtering method can be constituted of an aluminum alloy comprising 0.5 to 15 atom % of at least one element selected from an elemental group (Ag, Cu, Mg and Zn) used to increase the density of the generation of crystalline nucleus of the aluminum alloy and 0.01 to 5 atom % of at least one element selected from an elemental group (Co, Cr, Gd, Hf, Li, Mn, Mo, Nb, Nd, Ni, Pd, Pt, Ru, Sc, Sr, Ta, Ti, W, Y and Zr) used to prevent crystalline grains of the alloy from being coarsened, and, as remnant, Al and unavoidable impurities. A thin film formed by sputtering with this target remains a low specific resistance, shows a low hardness and is restrained in the occurrence of hillocks after anneal treatment.

It is noted that the composition of the target does not consistently coincide with that of the thin film obtained by sputtering the target, because of other sputtering conditions.

Also, in the sputtering method, a crystal grain growth by the elements (one or more types among Ag, Cu, Mg and Zn) to promote the generation of crystal nucleus, which is secured to the substrate after flying, proceeds in parallel to a restriction on the growth of grain diameter by the elements (one or more types among Co, Cr, Gd, Hf, Li, Mn, Mo, Nb, Nd, Ni, Pd, Pt, Ru, Sc, Sr, Ta, Ti, W, Y and Zr) to prevent the crystalline grains from being coarsened, which is secured to the substrate after flying likewise from the target. As a result, the crystal maintains a fine structure in which crystals are adjacent to each other through numerous grain boundaries. Eventually, the circumstance under which the thin film is formed by a sputtering method is the same as that under which superplastic deformation based on the generation mechanism caused by numerous grain boundary slips develops. The adoption of a sputtering method brings a major factor to provide the aluminum alloy of the present invention with superplastic deformation characteristics.

DETAILED DESCRIPTION OF A PREFERRED EMBODIMENT

Figure 1:
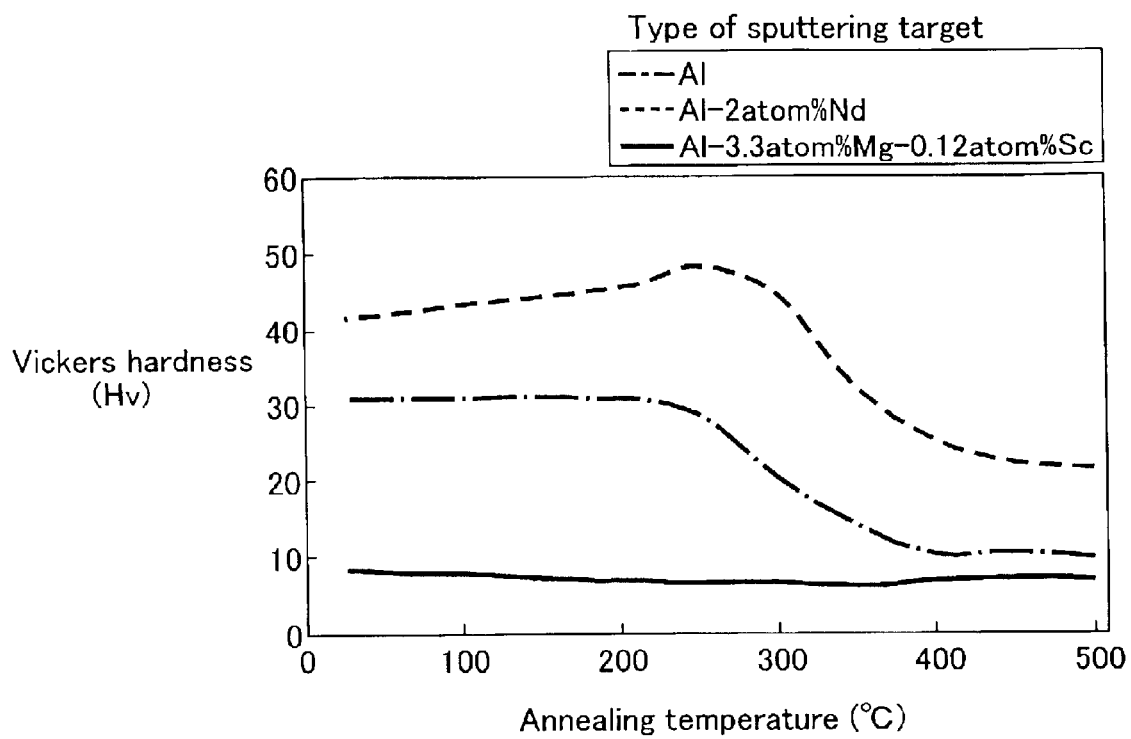
FIG. 1 is a graph showing the relationship between annealing temperature (° C.) and Vickers hardness (Hv) corresponding to each type of a sputtering target for forming a thin film aluminum alloy.

A sputtering target for forming a thin film aluminum alloy according to the present invention is prepared by the following method. Eventually, first, an alloy material having a composition comprising 0.5 to 15 atom % of one or more types selected from an elemental group consisting of Ag, Cu, Mg and Zn, 0.01 to 5 atom % of one or more types selected from an elemental group consisting of Co, Cr, Gd, Hf, Li, Mn, Mo, Nb, Nd, Ni, Pd, Pt, Ru, Sc, Sr, Ta, Ti, W, Y and Zr, and, as remnant, Al and unavoidable impurities, is melted in an argon atmosphere with a vacuum inductive melting furnace, followed by ingot-making. Next, the ingot obtained in this manner is deformed by usual hot working and thereafter made into the form of a sputtering target by cutting processing.

Further, the above sputtering target is placed in a usual DC. magnetron sputtering apparatus and a thin film aluminum alloy is made on a silicon wafer under usual sputtering conditions.

Then, the substrate obtained in the above step is maintained at a predetermined temperature within a range between 25° C. and 500° C. for 30 minutes and thereafter cooled gradually to obtain a thin film aluminum alloy.

The thin film aluminum alloy obtained in this manner has such physical properties that the specific resistance, the hardness and the number of hillocks to be generated are limited to lower values and fluctuations in these specific resistance, hardness and number of hillocks remains small against annealing temperature, eventually, these characteristics are affected little by annealing temperature. This shows that the thin film aluminum alloy of the present invention can possess physical properties, such as excellent hillock resistance even if it is formed in a sputtering filming step at room temperature without the necessity of annealing treatment, even taking it into consideration that the temperature of the surface of the substrate is raised to some extent by receiving the heat radiation of a plasma generated between the substrate and the target.

Accordingly, the above-mentioned thin film alloy is suitable as an electrode and wiring material used for semiconductor elements and liquid crystal displays.

Also, as mentioned above, the circumstance under which a thin film is formed on the substrate by a sputtering method well coincides with the circumstance under which superplastic deformation is developed in the point that growing crystals constitute numerous grain boundaries, maintaining a fine structure. The thin film aluminum alloy obtained in this manner has a low hardness and hillock resistance and in addition a film stress limited to a lower value. It allows to presume that the alloy is formed through superplastic deformation.

EXAMPLES

Example 1

An alloy material comprising 3.3 atom % of Mg metal, 0.12 atom % of Sc metal, and, as remnant, Al metal, is prepared and is melted in an argon atmosphere with a vacuum inductive melting furnace. The ingot obtained afterwards is deformed by hot processing and formed into a sputtering target by cutting processing. As to the dimension of the target at this time, the diameter is 250 mm and the thickness is 15 mm. This dimension is not limited when practicing the present invention.

Moreover, the above sputtering target is placed to a DC magnetron sputtering apparatus (trade name: "Ceraus Z-1000", manufactured and sold by ULVAC, INC., Japan) and a thin film aluminum alloy is made on a silicon wafer. The sputtering conditions at this time are as follows: sputtering power: about 9 W/cm$^2$, argon concentration: $3 \times 10^{-3}$ Torr, film thickness: 3000 Å (3000 to 10000 Å), substrate temperature when making a film: room temperature to 100° C. and silicon wafer dimension: 6 in. in diameter. These sputtering conditions are usually used and are not intended to limit the present invention.

After that, the filmed substrate obtained in the above step is maintained under vacuum at a predetermined temperature within a temperature range between 25° C. and 500° C. for 30 minutes and thereafter cooled gradually to obtain a thin film aluminum.

In the sputtering conditions of this example, the composition of the resultant thin film aluminum alloy is almost equal to that of the target.

Comparative Example 1

A sputtering target is formed in substantially the same manner as in Example 1 except that the alloy material is only Al, to obtain a thin film aluminum alloy having almost the same composition as the target.

Comparative Example 2

A sputtering target is formed in substantially the same manner as in Example 1 except for the composition of the alloy material comprising a 2 atom % of Nd metal, and as remnant, Al metal, to obtain a thin film aluminum alloy having almost the same composition as the target.

The hardness of each thin film aluminum alloy of Example 1, Comparative Example 1 and Comparative Example 2 in the case of changing the predetermined annealing temperature is measured to obtain the results by a Micro Vickers device as shown in the following Table 1 and FIG. 1.

TABLE 1

| Annealing temperature (° C.) | Vickers hardness of the alloy | | |
|---|---|---|---|
| | [Comparative Example 1] (Hv) | [Comparative Example 2] (Hv) | [Example 1] (Hv) |
| 25 | 30.86 | 41.61 | 8.3 |
| 200 | 30.80 | 45.60 | 6.9 |
| 250 | 28.70 | 48.27 | 6.8 |
| 300 | 20.40 | 44.65 | 6.8 |
| 350 | 14.20 | 32.38 | 6.1 |
| 400 | 10.20 | 25.40 | 6.9 |
| 450 | 10.50 | 22.30 | 7.1 |
| 500 | 9.80 | 21.40 | 7.0 |

As is clear from Table 1 and FIG. 1, the thin film aluminum alloy of the present invention maintains a lower level of hardness without depending largely on annealing temperature. Eventually, in Example 1, the average of the hardness (according to linear approximation, the same as in the following examples) at 25° C. to 500° C. is 7.1 Hv, whereas the variation range (a difference between the minimum value and the maximum value) is 2.2 Hv. Especially at 200° C. to 500° C., the average of hardness is 6.8 Hv, whereas the variation range is 0.9 Hv. That is, the variation range is significantly decreased and therefore the hardness is regarded as constant against annealing temperature. As compared to the above, the alloys of Comparative Example 1 and Comparative Example 2 show large fluctuation in hardness around the annealing temperature range between 200° C. and 400° C., which indicates that the hardness of these alloys is largely dependent on annealing temperature.

Also, the film stress of each thin film aluminum alloy of Example 1, Comparative Example 1 and Comparative Example 2 in the case of changing the predetermined annealing temperature is measured as a film strain by an X-ray diffractometer using a Ψ-constant method to obtain the results as shown in the following Table 2 and FIG. 2.

TABLE 2

| Annealing temperature (° C.) | Film stress of the alloy | | |
|---|---|---|---|
| | [Comparative Example 1] (kg/mm$^2$) | [Comparative Example 2] (kg/mm$^2$) | [Example 1] (kg/mm$^2$) |
| 25 | 12.000 | 32.700 | 5.300 |
| 200 | 13.200 | 36.900 | 5.400 |
| 250 | 6.500 | 37.200 | 4.400 |
| 300 | 5.300 | 37.100 | 4.700 |
| 350 | 5.200 | 27.500 | 4.400 |
| 400 | 4.800 | 12.500 | 4.400 |
| 450 | 4.900 | 10.300 | 4.300 |
| 500 | 4.500 | 10.100 | 4.200 |

Figure 2:
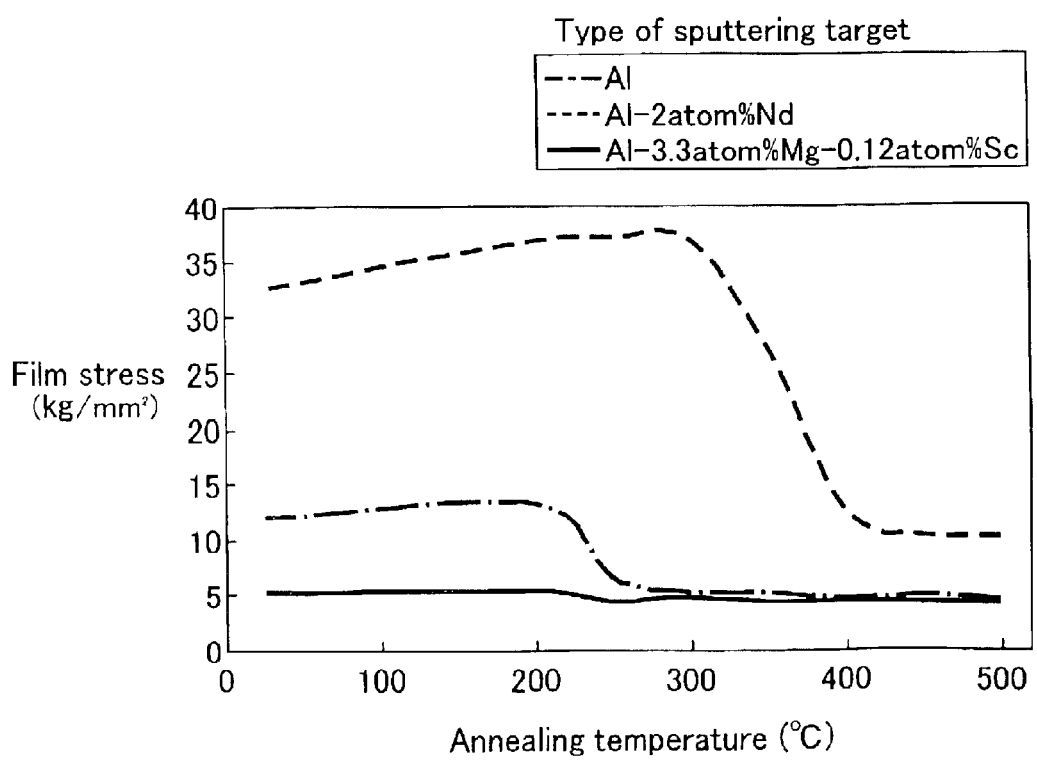
FIG. 2 is a graph showing the relationship between annealing temperature (° C.) and film stress (kg/mm$^2$) corresponding to each type of sputtering target for forming a thin film aluminum alloy.

As is clear from Table 2 and FIG. 2, the thin film aluminum alloy of the present invention maintains a lower level of film stress (residual stress) without depending largely on annealing temperature. Eventually, in Example 1, the average of the film stress at 25° C. to 500° C. is 4.756 kg/mm², whereas the variation range (a difference between the minimum value and the maximum value) is 1.200 kg/mm². Especially at 250° C. to 500° C., the average of film stress is 4.400 kg/mm², whereas the variation range is 0.500 kg/mm². That is, the width of variation is significantly decreased and therefore the film stress is regarded as constant against annealing temperature. As compared to the above, the alloys of Comparative Example 1 and Comparative Example 2 show large fluctuation in film stress around the annealing temperature range between 200° C. and 300° C., which indicates that each film stress of these alloys is largely dependent on annealing temperature.

This shows that the concentration of internal stress is sufficiently loosened in consideration of the above results shown in Table 1 and FIG. 1 and also shows that the generation of hillocks is disturbed.

Also, the number of hillocks generated on the surface of the film of each thin film aluminum alloy of Example 1, Comparative Example 1 and Comparative Example 2 in the case of changing the predetermined annealing temperature is measured by observing using a SEM (electron microscope) to obtain the results as shown in the following Table 3 and FIG. 3.

TABLE 3

| Annealing temperature (° C.) | Number of hillocks on the surface of the alloy film | | |
|---|---|---|---|
| | [Comparative Example 1] (pcs/mm²) | [Comparative Example 2] (pcs/mm²) | [Example 1] (pcs/mm²) |
| 25 | 0 | 0 | 0 |
| 200 | 6000 | 0 | 0 |
| 250 | 9600 | 0 | 0 |
| 300 | 17400 | 0 | 0 |
| 350 | 23800 | 0 | 0 |
| 400 | 31000 | 10 | 0 |
| 450 | 39000 | 4000 | 0 |
| 500 | 51000 | 16000 | 10 |

Figure 3:
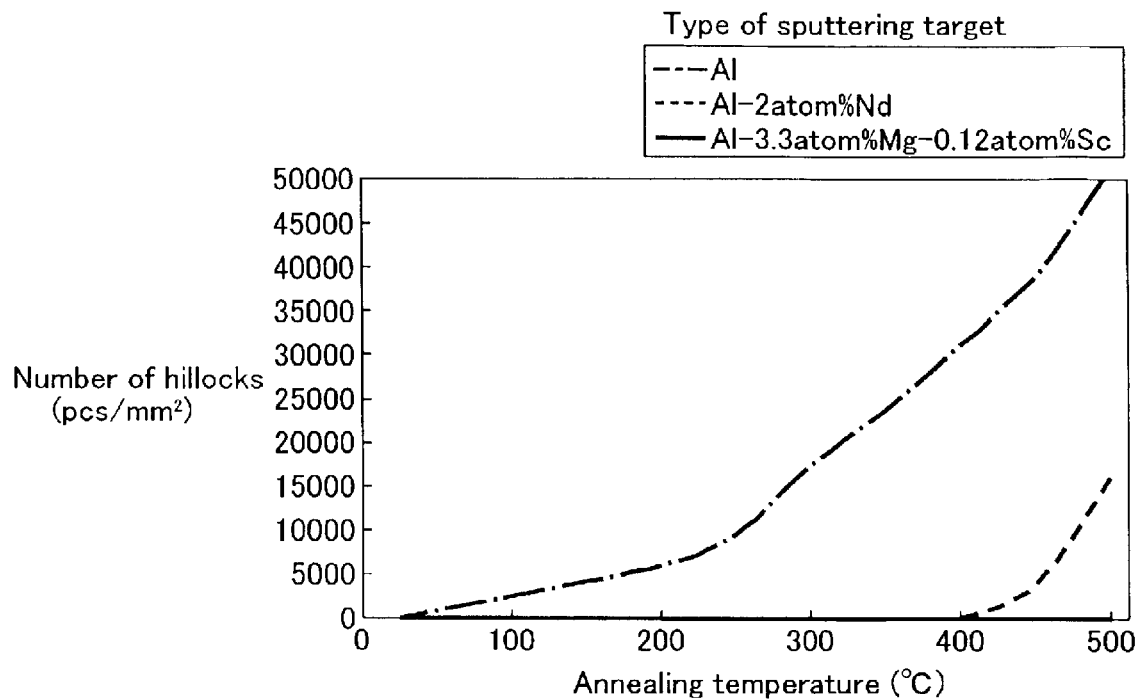
FIG. 3 is a graph showing the relationship between annealing temperature (° C.) and the number of hillocks (pcs/mm$^2$) corresponding to each type of a sputtering target for forming a thin film aluminum alloy.

As is clear from Table 3 and FIG. 3, it is shown that the thin film aluminum alloy of the present invention has sufficient hillock resistance.

Also, the specific resistance of each thin film aluminum alloy of Example 1, Comparative Example 1 and Comparative Example 2 in the case of changing the predetermined annealing temperature is calculated from the sheet resistance measured by a four probe method at room temperature and the film thickness, to obtain the results as shown in the following Table 4 and FIG. 4.

TABLE 4

| Annealing temperature (° C.) | Specific resistance of the alloy | | |
|---|---|---|---|
| | [Comparative Example 1] ($\mu\Omega \cdot$ cm) | [Comparative Example 2] ($\mu\Omega \cdot$ cm) | [Example 1] ($\mu\Omega \cdot$ cm) |
| 25 | 2.80 | 10.20 | 4.6 |
| 200 | 2.79 | 9.80 | 3.8 |
| 250 | 2.78 | 9.70 | 3.5 |
| 300 | 2.77 | 7.80 | 3.2 |
| 350 | 2.80 | 3.80 | 3.0 |
| 400 | 2.81 | 3.40 | 3.3 |

TABLE 4-continued

| Annealing temperature (° C.) | Specific resistance of the alloy | | |
|---|---|---|---|
| | [Comparative Example 1] ($\mu\Omega \cdot$ cm) | [Comparative Example 2] ($\mu\Omega \cdot$ cm) | [Example 1] ($\mu\Omega \cdot$ cm) |
| 450 | 2.78 | 3.40 | 3.1 |
| 500 | 2.78 | 3.30 | 3.0 |

Figure 4:
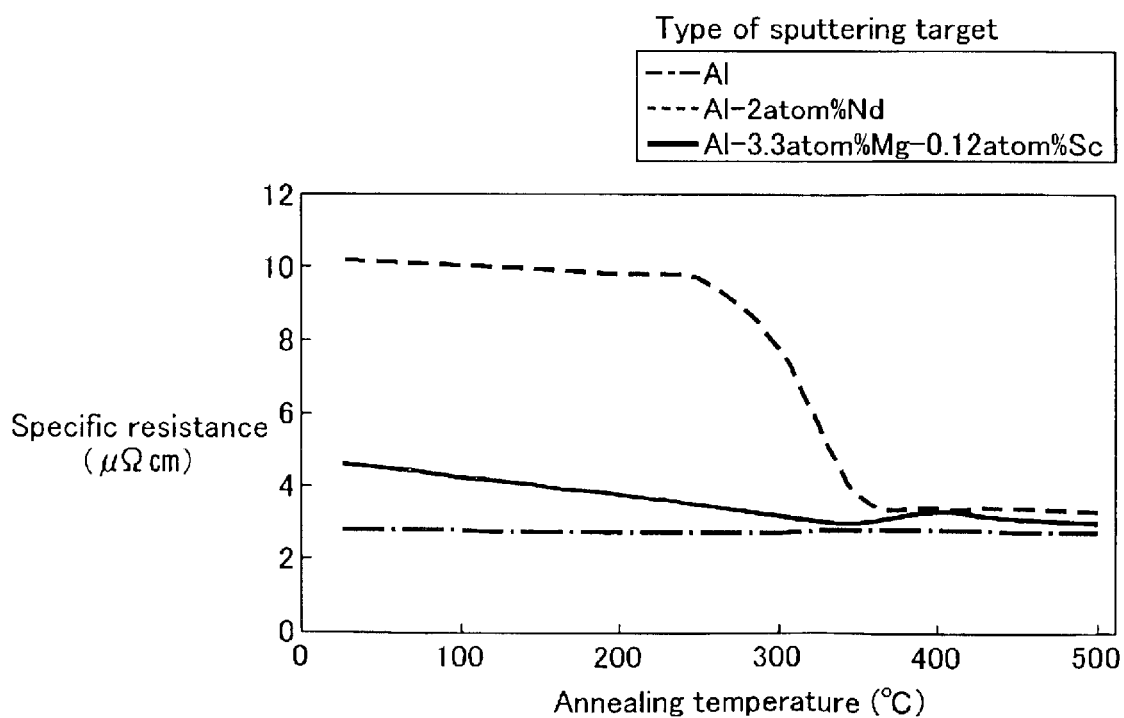
FIG. 4 is a graph showing the relationship between annealing temperature (° C.) and specific resistance ($\mu\Omega$·cm) corresponding to each type of a sputtering target for forming a thin film aluminum alloy.

As is clear from Table 4 and FIG. 4, the thin film aluminum alloy of the present invention maintains a lower specific resistance and reduces specific resistance along with a rise in annealing temperature with the result that the thin film alloy exhibits a similar specific resistance to that of high purity Al.

As is clear from the foregoing explanations, the thin film aluminum alloy of the present invention is not largely dependent on annealing temperature but has high hillock resistance while maintaining a low specific resistance and hardness. Thus, it is reasonable from the value of the film stress as residual stress that this characteristic is obtained as a result of the development of superplastic deformation. Further, when a sputtering target containing the elements constituting such a thin film aluminum alloy is used, it is possible to obtain the above-mentioned thin film aluminum alloy by a sputtering method.

What is claimed is:

1. A thin film aluminum alloy having a Vickers hardness of 30 Hv or less and a film stress (absolute value indication) of 30 kg/mm² or less when performing annealing treatment at 25° C. to 500° C., wherein said hardness and said film stress are distributed in a predetermined hardness range and in predetermined film stress range respectively within the temperature range of said annealing treatment and are respectively almost constant against annealing temperature.

2. The thin film aluminum alloy according to claim 1, and alloy comprising, as alloy components, 0.5 to 15 atom % of one or more types selected from Co, Cr, Gd, Hf, Li, Mn, Mo, Nb, Nd, Ni, Pd, Pt, Ru, Sc, Sr, Ta, Ti, W, Y and Zr, and, as remnant, Al and unavoidable impurities.

3. The thin film aluminum alloy according to claim 1 or 2, wherein the alloy is made by forming Al and unavoidable impurities containing said alloy components as a film on a substrate by a sputtering method.

4. The thin film aluminum alloy according to claim 1 or 2, wherein the thin film aluminum alloy has superplastic deformation characteristics.

5. The thin film aluminum alloy according to claim 1 or 2, wherein the thin film aluminum alloy is used as an electrode or wiring material for a semiconductor element or a liquid crystal display.

6. A sputtering target for forming a thin film aluminum alloy, said sputtering target being prepared by a process comprising the following steps:

providing an aluminum alloy comprising 0.5 to 15 atom % of at least one element selected from Ag, Cu, Mg and Zn, 0.01 to 5 atom % of at least one element selected from Co, Cr, Gd, Hf, Li, Mn, Mo, Nb, Nd, Ni, Pd, Pt, Ru, Sc, Sr, Ta, Ti, W, Y and Zr, and, as remnant, Al and unavoidable impurities;

melting the aluminum alloy to obtain a melted alloy;

forming an ingot with the melted alloy;

deforming the ingot via hot working; and cutting the deformed ingot to form the sputtering target.

* * * * *

UNITED STATES PATENT AND TRADEMARK OFFICE
CERTIFICATE OF CORRECTION

PATENT NO. : 6,791,188 B2
DATED : September 14, 2004
INVENTOR(S) : Junichiro Hagihara et al.

It is certified that error appears in the above-identified patent and that said Letters Patent is hereby corrected as shown below:

Column 8,
Line 33, delete "in predetermined" and substitute therefor -- in a predetermined --.
Line 36, delete "and" and substitute therefore -- said --.
Line 38, insert after "selected from" the following -- Ag, Cu, Mg and Zw and 0.01 to 5 atom % of one or more types selected from --.

Signed and Sealed this

Seventeenth Day of May, 2005

JON W. DUDAS
*Director of the United States Patent and Trademark Office*